(12) United States Patent
Dimen

(10) Patent No.: US 10,877,532 B2
(45) Date of Patent: Dec. 29, 2020

(54) FUNCTIONAL REDUNDANCY OF COMMUNICATIONS AND DATA TRANSMISSION IN ENERGY STORAGE SYSTEM

(71) Applicant: Tesla, Inc., Palo Alto, CA (US)

(72) Inventor: Ian C. Dimen, San Francisco, CA (US)

(73) Assignee: Tesla, Inc., Palo Alto, CA (US)

( * ) Notice: Subject to any disclaimer, the term of this patent is extended or adjusted under 35 U.S.C. 154(b) by 28 days.

(21) Appl. No.: 15/300,044

(22) PCT Filed: Apr. 2, 2015

(86) PCT No.: PCT/US2015/024148
§ 371 (c)(1),
(2) Date: Sep. 28, 2016

(87) PCT Pub. No.: WO2015/153911
PCT Pub. Date: Oct. 8, 2015

(65) Prior Publication Data
US 2017/0177048 A1 Jun. 22, 2017

Related U.S. Application Data

(60) Provisional application No. 61/974,225, filed on Apr. 2, 2014.

(51) Int. Cl.
G06F 1/26 (2006.01)
G01R 31/382 (2019.01)
(Continued)

(52) U.S. Cl.
CPC ............. *G06F 1/26* (2013.01); *G01R 31/382* (2019.01); *G01R 31/396* (2019.01);
(Continued)

(58) Field of Classification Search
CPC ........ G06F 3/067; G06F 3/0619; G06F 3/064; G06F 3/061; G06F 3/0689;
(Continued)

(56) References Cited

U.S. PATENT DOCUMENTS 4,937,811 A 6/1990 Harris
5,687,014 A 11/1997 Czerwiec et al.
(Continued)

FOREIGN PATENT DOCUMENTS

CN 101860053 A 10/2010
CN 102843331 A 12/2012
(Continued)

OTHER PUBLICATIONS

European Patent Office; Extended European Search Report; EP Application 15774092.9; dated Nov. 8, 2017; 7 pgs.
(Continued)

Primary Examiner — Keshab R Pandey
(74) Attorney, Agent, or Firm — Knobbe, Martens, Olson & Bear, LLP

(57) ABSTRACT

An energy storage system includes: a host; energy storage modules; a plurality of nodes, each implemented at a corresponding one of the energy storage modules and configured to monitor and control that energy storage module; a communications and data transmission medium forming a loop from a first portion of the host and sequentially through the nodes to a second portion of the host; and in each of the nodes, first and second devices configured to perform at least partially redundant communication and data transmission functions using the communications and data transmission medium.

29 Claims, 6 Drawing Sheets

(51) Int. Cl.
*H01M 10/42* (2006.01)
*H04W 52/00* (2009.01)
*H04Q 9/00* (2006.01)
*G01R 31/396* (2019.01)
*H01M 10/48* (2006.01)

(52) U.S. Cl.
CPC ......... *H01M 10/425* (2013.01); *H01M 10/48* (2013.01); *H04Q 9/00* (2013.01); *H04W 52/00* (2013.01); *H01M 2010/4278* (2013.01); *H04Q 2209/30* (2013.01)

(58) Field of Classification Search
CPC .......... G06F 11/1076; G06F 1/32; G06F 9/44; G06F 1/28; G06F 1/26
See application file for complete search history.

(56) References Cited

U.S. PATENT DOCUMENTS

| | | | |
|---|---|---|---|
| 2004/0071238 A1* | 4/2004 | Khlat | H03F 1/304 375/346 |
| 2005/0058390 A1 | 3/2005 | Iwai | |
| 2008/0180106 A1* | 7/2008 | Gorbold | G01R 31/396 324/434 |
| 2010/0188972 A1 | 7/2010 | Knapp | |
| 2010/0259221 A1* | 10/2010 | Tabatowski-Bush | H01M 10/4207 320/134 |
| 2011/0101920 A1 | 5/2011 | Seo et al. | |
| 2011/0267854 A1 | 11/2011 | Flannery et al. | |
| 2012/0203482 A1* | 8/2012 | Parle | G01R 31/3835 702/63 |
| 2013/0066572 A1 | 3/2013 | Terashima et al. | |
| 2013/0141230 A1 | 6/2013 | Chandler et al. | |
| 2013/0286942 A1* | 10/2013 | Bonar | H04B 7/0689 370/328 |
| 2013/0293251 A1* | 11/2013 | Martin | G06F 13/4247 324/750.3 |
| 2013/0294530 A1* | 11/2013 | Martin | G06F 13/4247 375/257 |
| 2014/0040242 A1* | 2/2014 | Zhou | G06F 17/30067 707/722 |
| 2014/0129164 A1 | 5/2014 | Gorbold | |
| 2014/0147713 A1* | 5/2014 | Mizobe | H01M 10/482 429/90 |
| 2014/0212714 A1* | 7/2014 | Butzmann | H01M 10/48 429/90 |
| 2016/0025795 A1 | 1/2016 | Marlin et al. | |
| 2017/0010329 A1 | 1/2017 | Tang et al. | |
| 2019/0006723 A1 | 1/2019 | Martin et al. | |

FOREIGN PATENT DOCUMENTS

| | | |
|---|---|---|
| CN | 102918739 A | 2/2013 |
| EP | 1099119 A1 | 5/2001 |
| EP | 2663028 A1 | 11/2013 |
| JP | 2007-042501 A | 2/2007 |
| JP | 2010246372 | 10/2010 |
| JP | 2013078233 | 4/2013 |
| KR | 1020130142184 | 5/2015 |

OTHER PUBLICATIONS

International Searching Authority; International Search Report and Written Opinion; International Application No. PCT/US2015/024148; dated Aug. 19, 2015; 14 pgs.

China National Intellectual Property Administration; Search Report; CN Application No. 201580018681.7; dated Aug. 13, 2018; 2 pgs.

\* cited by examiner

FUNCTIONAL REDUNDANCY OF COMMUNICATIONS AND DATA TRANSMISSION IN ENERGY STORAGE SYSTEM

CROSS-REFERENCE TO RELATED APPLICATIONS

The present U.S. Utility Patent Application is a U.S. National Phase Application submitted under 35 U.S.C. § 371 of Patent Cooperation Treaty Application No. PCT/US2015/024148, filed Apr. 2, 2015 and entitled, "Functional redundancy of communications and data transmission in energy storage system", which claims priority pursuant to 35 U.S.C. § 119(e) to U.S. Provisional Application No. 61/974,225, filed Apr. 2, 2014 and entitled "Frequency multiplexed battery communications," both of which are incorporated herein by reference in their entirety and made part of the present application for all purposes.

BACKGROUND

Multiple types of energy storage systems exist. For example, some systems store electrical energy in rechargeable electrolytic cells. Some level of control over the components of energy storage systems is desirable to ensure safe and efficient operation.

SUMMARY

In a first aspect, an energy storage system includes: a host; energy storage modules; a plurality of nodes, each implemented at a corresponding one of the energy storage modules and configured to monitor and control that energy storage module; a communications and data transmission medium forming a loop from a first portion of the host and sequentially through the nodes to a second portion of the host; and in each of the nodes, first and second devices configured to perform at least partially redundant communication and data transmission functions using the communications and data transmission medium.

Implementations can include any or all of the following features. The first and second devices perform fully redundant communication and data transmission functions. The communication and data transmission functions performed by the second device have reduced accuracy compared to the communication and data transmission functions performed by the first device. The first and second devices perform fully redundant monitoring or measurement functions on the node. The communications and data transmission medium consists of two physical conductors and wherein communications and data transmission are performed over the two physical conductors with a differential data scheme. The communications and data transmission medium and each of the nodes are connected to each other by transformer coupling and passive frequency division multiplexing. The passive frequency division multiplexing is performed by a passive crossover circuit, the passive crossover circuit comprising a lowpass arm with an RL circuit to the first device, and a highpass arm with an RC circuit to the second device, and wherein the transformer coupling comprises a magnetic transformer between the communications and data transmission medium and the passive crossover circuit. The passive crossover circuit further comprises a respective secondary lowpass filter path on each of the RL and RC circuits, each secondary lowpass filter path comprising a series resistor and a shunt capacitor. The energy storage system further comprising an RC highpass filter in the secondary lowpass filter path of the highpass arm. The node includes at least one integrated circuit in which the first and second devices are implemented, wherein the RL and RC circuits and the secondary lowpass filter paths are positioned outside the at least one integrated circuit, and wherein the RC highpass filter are part of the at least one integrated circuit. A frequency shift keyed signal is transmitted at least in the highpass arm, wherein the node includes a frequency discrimination circuit configured to discriminate between components of the frequency shift keyed signal, wherein the frequency discrimination circuit forms a datapath that includes at least two one-sample delay registers and a feedback loop having a first adder, and wherein the frequency shift keyed signal is added to the datapath with a second adder positioned between the two one-sample delay registers. The frequency discrimination circuit includes a negation in the datapath, wherein the frequency shift keyed signal is represented using a two's complement sign representation in which arithmetic negation of a signal (x) is effected by: $-x=\text{NOT}(x)+1$, and wherein the frequency discrimination circuit omits the +1 operation in performing the negation. The frequency discrimination circuit has a response frequency defined by a constant k in a gain block such that k=0 centers the response frequency at one fourth of a sampling frequency of the frequency shift keyed signal. The constant k for the frequency discrimination circuit is selected as $+/-2^q$, where q is an integer, wherein the frequency discrimination circuit has an alteration of wiring connections that implements a bit-shift representing the gain block. For negative values of the constant k, the frequency discrimination circuit includes a negation operation after the adder in the feedback loop. The frequency discrimination circuit includes a norm detector block generating an output that represents energy accumulation by the frequency discrimination circuit, and wherein when the output exceeds a threshold, the frequency discrimination circuit resets the one-sample delay registers. Each of the first and second adders has signed overflow detection, wherein the frequency discrimination circuit performs threshold detection through combination by logical OR of respective overflow signals from the first and second adders. The frequency discrimination circuit includes a latching block configured to latch frequency discriminated pulse streams, and an accumulator register set and an ALU, wherein the latching block generates for the accumulator register set and the ALU (i) a direction signal that is true for an input value of 1, false for an input value of −1, and false for an input value of 0, and (ii) an increment decrement command signal that is true if either a 1 or −1 is present, and 0 otherwise. The first and second devices receive respective first and second signal components, wherein the node includes at least one edge detector for detecting a shift of signal energy, the edge detector configured to perform convolution on a pulse density stream with a bipolar, rectangular impulse response whose values are either −1 or 1 such that the convolution involves a conditional sign change operation.

In a second aspect, an energy storage system includes: a host; a plurality of energy storage modules; a plurality of nodes, each implemented at a corresponding one of the energy storage modules and configured to monitor and control that energy storage module; a communications and data transmission medium forming a loop from a first portion of the host and sequentially through each of the nodes to a second portion of the host; and in each of the nodes, means for performing at least partially redundant communication and data transmission functions using the communications and data transmission medium.

In a third aspect, a method of communicating and transmitting data in an energy storage system includes: generating a signal from a host to at one of a plurality of nodes in the energy storage system, each of the nodes implemented at a corresponding one of energy storage modules and configured to monitor and control that energy storage module, the signal received through a communications and data transmission medium forming a loop from a first portion of the host and sequentially through each of the nodes to a second portion of the host; directing a first portion of the signal to a first device in the node; directing a second portion of the signal to a second device in the node; performing, by the first device and based on the first portion, a first function of communication or data transmission; and performing, by the second device and based on the second portion, a second function of communication or data transmission, the first and second functions being at least partially redundant.

Implementations can include any or all of the following features. The method further includes configuring the host to send signals in a clockwise direction in the loop only to any of the nodes located before a particular segment of the communications and data transmission medium in the clockwise direction, and to send signals in a counterclockwise direction in the loop only to any of the nodes located before the particular segment in the counterclockwise direction, wherein each of the nodes is configured to respond only in the clockwise or the counterclockwise direction from which the signal arrived at the node. Each of the nodes is configured to transmit identical responses to a signal from the host in clockwise and counterclockwise directions in the communications and data transmission medium. The host uses a signaling scheme based on frequency shift keying with Manchester encoding, the method comprising preceding a valid signal with a synchronization sequence recognized by an encoder in each of the nodes, and preceding the synchronization sequence with an illegal pattern that never appears inside a valid signal. The node includes a filter that performs frequency discrimination on signals x and y, the method further comprising determining an approximate signal energy as $|x|+|y|$ or as $Max(|x|,|y|)$, and comparing the approximate signal energy with a threshold. The approximate signal energy is determined as $Max(|x|,|y|)$, and wherein the threshold is set to a number that requires one extra bit to represent than a width of a data bus in the node, the method further comprising detecting that the approximate signal energy is about to reach the threshold, and discarding the one extra bit before the approximate signal energy equal to the threshold is generated. The method further includes performing edge detection in each node for detecting a shift of signal energy. The edge detection includes convolution on a pulse density stream, the method further comprising down-sampling the pulse density stream so that output samples are produced at a fixed number of times of a rate of a convolution kernel. One round of accumulation in the edge detection is performed at such a rate that at most one input pulse arrives during the round of accumulation. A positive pulse arrives during the round of accumulation, the method further comprising latching the positive pulse for a next round of accumulation, and thereafter adding or subtracting the positive pulse from accumulator registers, unless a negative pulse also arrives during the round of accumulation, in which case the method further comprises annulling the positive input pulse.

DETAILED DESCRIPTION

This document describes examples of redundant function performance in the communications and data transmissions of energy storage systems, such as in a battery pack of lithium-ion cells. A distributed battery monitoring system can exhibit at least partial functional redundancy with regard to all communications and data transmission functions using only two electrical conductors between adjacent communication nodes in the battery. In some implementations, two independent, separate communications schemes share the same galvanically isolated communications medium of circular topology, which can be physically segmented at the nodes. Each scheme is bidirectional with respect to each medium segment to allow data to be routed either way (or both ways) around the circle. This can reduce or eliminate the impact of a disruption at any segment of the communications medium.

Some or all of the nodes can have physically separate and functionally redundant devices to which the respective schemes are assigned, which can reduce or eliminate the impact of a disruption or destruction of such a device. In some implementations, the redundant devices can have somewhat different functionalities. For example, a first device can have similar measurement functions to a second device, but those in the first device can have reduced accuracy specifications or requirements. This can provide for fault tolerance and reliable operation of the energy storage system, such as within the powertrain of an electric vehicle, while minimizing the additional cost. As another example, the devices can have completely different functionality if the aim is to provide only the data that is necessary in a given failure scenario, so as to allow a desired level of system functionality.

Figure 1:
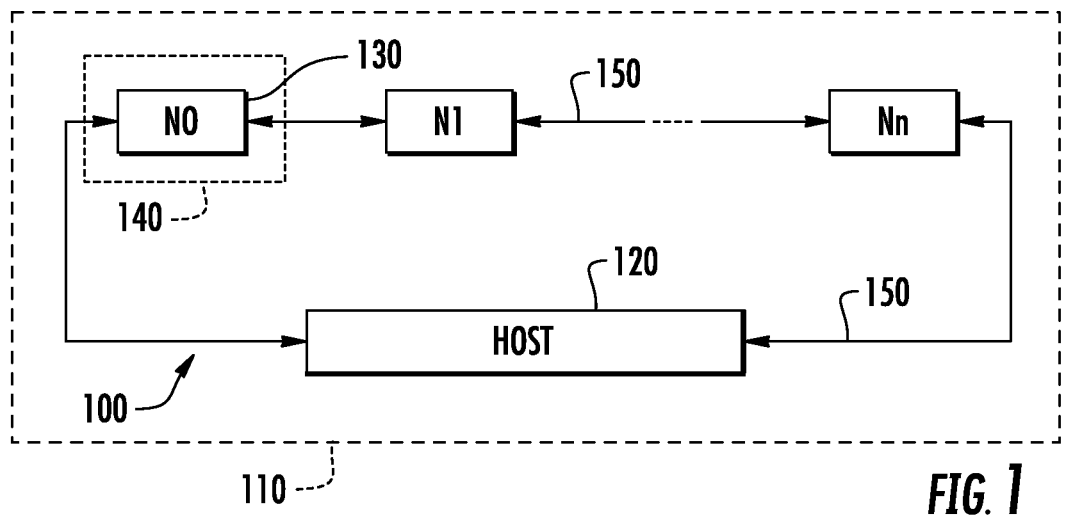
FIG. 1 shows an example of a communication system in an energy storage.

FIG. 1 shows an example of a communications system 100 in energy storage 110. The energy storage is a unit that is designed and implemented for providing energy, and/or for being provided with energy, in a particular context. The energy storage can be installed as the (or one) energy source in a vehicle, such as in form of a battery pack in an electric vehicle, or it can serve as stationary storage for electric energy in combination with a source of electricity (e.g., solar panels), to name just two examples.

The communications system 100 includes a host 120 that engages in communications with any or all of multiple nodes from time to time, such as to monitor their status or to collect data from them. The host can be implemented in software, firmware or hardware, or combinations thereof. For example, the host can include executable instructions for using multiple schemes to communicate with the nodes and exchange data transmissions with them.

The communications system 100 includes multiple nodes 130. Here, the nodes are labeled $N_1$ through $N_n$, where n is equal to or greater than two. From a network perspective, the host 120 can also be considered a node since it communicates with other entities on the bus and is recognized by them. However, for clarity the above nomenclature will be followed in this description.

Each of the nodes is implemented in association with a particular energy storage module 140 in the energy storage 110. That is, the node controls the operation of the associated energy storage module and can monitor the operation and other characteristics thereof. The node can be implemented in software, firmware or hardware, or combinations thereof. For example, the node can include executable instructions for using multiple schemes to communicate with the host and exchange data transmissions with it.

In some implementations, the energy storage module to which the node is assigned is a physically segregated unit in the energy storage 110. For example, the module is a housing that contains lithium-ion cells electrically connected with each other, wherein the housing has electrical contacts on its outside for charging or discharging the cells.

The communications system 100 includes a communications medium 150 that connects pairs of the nodes 130 to each other into a continuous string, and the ends of that string into the host. This gives the communication system 100 the form of a loop having a circular topology. The medium is used for conveying signals that propagate in either direction (that is, clockwise or counterclockwise) through the entire loop or through a part thereof. The medium can be made from any material that conveys a signal with sufficient fidelity that it can be detected by the intended recipient in the system. For example, when electrical signals are to be transmitted, the medium should include an electrically conductive material.

That is, the communication system 100 can be implemented so as to control each of the multiple energy storage modules with regard to safe operation, proper monitoring and effective energy management. For example, the host and the nodes are configured to communicate and transmit data between each other. The communications system facilitates data gathering by the host from the nodes, and the transmission of signals from the host to each node to activate or deactivate any functions executable in the node(s) and the transmission of responses to such signaling. In some implementations, the communications system is configured so that all data transfers are initiated by a command or request from the host, which can simplify the protocol and eliminate the need for bus arbitration schemes.

In some implementations, the host collects statistics regarding the success and failure of communications relating to each node on the network, and/or of data transmission across each segment of the communications medium. This can allow the host to choose its behavior so as to avoid using any segment that it suspects of intermittent or faulty operation. In some implementations, the host can occasionally transmit data on the network to interrogate the integrity of the network. For example: a transmitted package can be routed around the loop until it arrives back at the host, and/or the package can instruct nodes to initiate autonomously sequenced tests of a segment. These or other functionalities can aid the host in ascertaining the integrity of the network on a segment-by-segment basis, thus facilitating an attempt to isolate faults in the network.

The energy storage 110 and the energy storage module 140 are mentioned above to provide illustrative context for exemplification of the communications system. For simplicity, these and some other aspects of the illustrated examples will not be explicitly shown in the following illustrations. Also, the host and the nodes connected into the network of circular topology can have different spatial relationships with regard to each other. As such, different layout patters, or stacking patterns, of the various components can be used, to name just a few examples.

Figure 2:
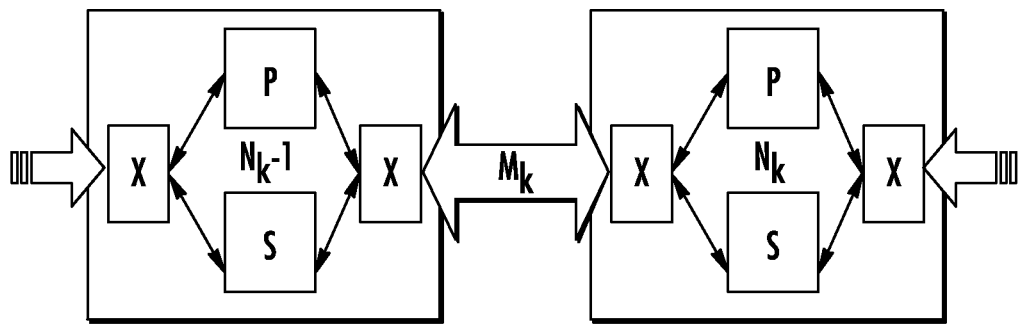
FIG. 2 shows an example of a node structure with subnodes that can be used in the communication system of FIG. 1.

FIG. 2 shows an example of a node structure with subnodes that can be used in the communication system of FIG. 1. Two nodes are shown in this example that are labeled $N_{k-1}$ and $N_k$, respectively, where k is a number from one to n, and n is the total number of nodes in a particular implementation. That is, this example relates to an arbitrary pair of the nodes 130 anywhere in the circular topology. As mentioned earlier, the two nodes are connected by a segment of the communications medium, the segment here labeled $M_k$.

Each of the nodes has monitoring or measuring devices, which are here labeled P (primary subnode) and S (secondary subnode), respectively. In this example, two subnodes are shown for each node but more than two can be used. Such devices will perform redundant functions regarding at least communications and data transmission, based on signaling through the medium using two or more communications schemes. The subnodes can be physically separate from each other in the node. In the current example, some performance aspects have been sacrificed in the secondary subnode compared to the primary subnode, hence the P and S labeling. In other implementations, however, these devices can be identical in functionality and therefore fully redundant.

Turning now to the medium segment $M_k$, this and the pair of double headed arrows leading to the respective subnodes P and S correspond to a particular segment of the communications medium 150 in FIG. 1. These medium segments facilitate communications among all the P subnodes and the host using one communications scheme, and they also facilitate communications among all the S subnodes and the host using another communications scheme.

Each communication scheme being used on the circular bus of the communications system provides the ability to successfully transmit a packet of information to a given node also in the face of failure of a particular medium segment. This provides tolerance to single point faults in the medium. In some implementations, the schemes operate in this manner also when faced with a medium segment that is only intermittently faulty, which can further increase reliability of the system.

The component labeled X is positioned between the medium segment $M_k$ and the pair of double headed arrows leading to the respective subnodes. That is, each of the nodes ($N_{k-1}$ and $N_k$ in this example) has two of the component X, which allows the (at least) two communications schemes to share the same segment of communications medium with minimal interference. In some implementations, the component X includes passive components, such as resistors, capacitors, inductance and transformers. For example, this can provides advantages from a cost, robustness, and/or reliability perspective. In other implementations, however, the component X can instead or additionally include active components.

Passive frequency division multiplexing is used in some implementations of a communications system. This can allow the two devices of a redundant pair (here, the subnodes) to operate simultaneously on the same segment of communications medium with complete disregard for each other's state of operation. Stated somewhat differently, the risk that malfunction of either device disrupts operation of its functionally redundant partner can be minimized. Also, passive multiplexing is not limited to two multiply redundant subnetworks, but rather can be applied to any number of them. This allows more than two subnodes to access the communications medium without mutual interference.

In frequency division multiplexing implementations, the component X can serve to filter signals in the frequency domain so that signals in one frequency band are allowed to propagate from one subnode P to another subnode P, while substantially preventing these signals from propagating to the subnode(s) S. On the other hand, signals in another frequency band are allowed to propagate in the converse manner, from subnode S to S, and prevented from reaching P. In the illustration, this is represented by the double-headed arrows connecting the component X with the respective subnodes P and S.

In some implementations, the frequency bands are chosen so that one of them nominally includes 0 Hz, a direct-current (DC) signal. This makes that band easily selected by use of a lowpass filter and excluded by use of a highpass filter. As an example regarding the transmission of signals, after such filtering the two signal bands are combined and connected to a component that allows signal transmission across a galvanic isolation barrier substantially without selectivity in frequency. Any of various suitable types of component can be used for this purpose, including, but not limited to, a magnetic transformer, a DC blocking capacitor, an acoustic coupler, or another device that transmits and receives signals across an electrically insulating member.

Figure 3:
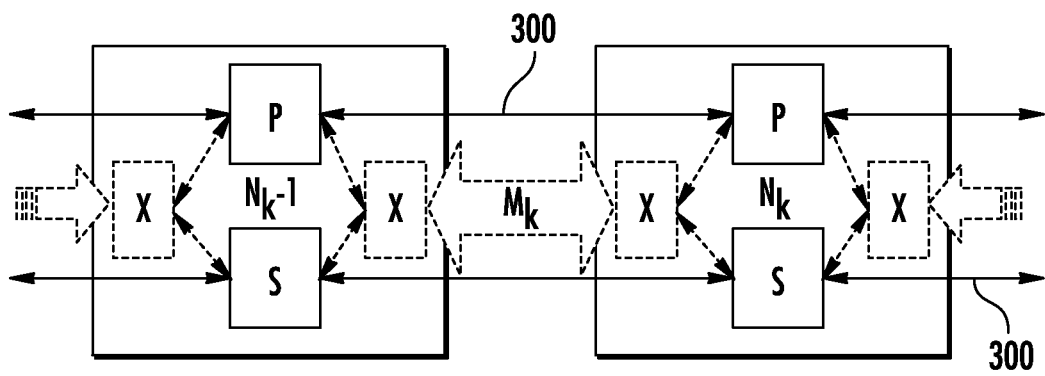
FIG. 3 shows an example of logical node connectivity for the node structure of FIG. 2.

FIG. 3 shows an example of logical node connectivity for the node structure of FIG. 2. This example corresponds to the previous illustration except that arrows 300 indicating the logical data flow are shown. Accordingly, the medium segments, the components X and the double headed arrows discussed above, which indicate physical signal flow, are here shown in phantom.

The component X allows the communications system to effectively be decomposed into separate, interoperable subsystems, in these examples two such subsystems. When the component X operates correctly, the presence of communication signal from one scheme (e.g., for the P subnode) on any medium segment will have no effect on transmission, propagation or reception of signals from another scheme (e.g., for the S subnode) on the same segment. That is, the arrows 300 here represent, on the one hand, the logical flow of data between respective subnodes P and the host, and on the other, the logical flow of data between respective subnodes S and the host.

These logical flows can correspond to signals regarding any of multiple types of operations that are performed in various parts of the communications system. First, communications are exchanged between the host and the nodes, such as to perform status checks and/or to control node operation. Redundant versions of these communications are then received by, or sent from, the respective subnodes P and S and are represented by the arrows 300 in this example. Similarly, data can be transmitted between the host and the respective subnodes, and the arrows 300 represent such transmissions as well. For example, redundant versions of such data are generated by the subnodes of a particular node in response to an information request from the host. Other functions that can be performed partially or fully redundantly by respective subnodes include, but are not limited to, monitoring functions (e.g., the node determines if its energy storage module is operating properly) and measuring functions (e.g., the node measures some operating characteristic of its energy storage module).

Moreover, as a result of the circular topology of the communications system, the removal of any one segment (e.g., $M_k$) will not completely disconnect any subnode from the host. Rather, a path from that node to the host will still be intact for signals traveling clockwise or counterclockwise in the loop, as the case may be. Another benefit is that malfunction or loss of any given subnode will affect at most that subnode, and will not disrupt communications from the other subnode of that host as long as the component X is functioning. In some implementations, a requirement specified for the function performed by the component X is that malfunction or loss of a subnode does not disrupt communications flow to the other subnode(s) of the same node.

To discuss communications operations in general, to the extent their correct function depends on the physical topology of the communications medium they should be amenable to termination of the communications medium at any point in the network. For example, the system may contain a command to cause a particular node to change from one state to another. Some implementations are configured such that when the reception of that command would be indeterminate, the system is prevented from sending the command. This is because when a node is not definitely known to have received the command, the state of that node would then also become unknown.

As an example will be mentioned the assignment of sequential addresses to serially connected notes based on their physical position. In some implementations, the host performs such address assignment by transmitting to the first node (e.g., to $N_0$ or $N_n$ in FIG. 1) a packet that contains an address and a "time to live" number. That node assigns itself the address of the packet, increments the address and decrements the "time to live" number. If the decremented "time to live" number is zero, then the node does not transmit the packet to any other nodes. Otherwise, the node transmits the modified packet. That is, if the host can ascertain that a medium segment is in an unknown state of operability, the host can avoid transmitting address packets that have any effect on nodes that are on the opposite side of that segment from where the packet originated. This allows the host to maintain a completely deterministic address assignment by avoiding the use of that segment. This discussion of addressing operations is for illustrative purposes only, and the ability to target only nodes up to a certain position in the circular topology of the communications system is useful to data transmissions in general.

The above requirement can be satisfied in other ways. For example, a conditional retransmission of a data packet based on a binary state of the node can be used. Such state can be altered by reception of a separate data packet, or altered automatically by the reception of the data packet to be retransmitted. As another example, an acknowledge response from the node can be used to verify correct reception of a data packet.

The communications system also defines the particular ways that nodes on a circular bus respond to the host according to the communication schemes. For example, it can be specified that the node must respond to the data request in a manner such that the response will arrive at the requesting node (here, the host). Thus, assuming that the host can avoid transmitting data across a segment that is intermittent or faulty, the node can then send its response back in the opposite direction from which the request came. However, there may be instances where more than one segment is intermittent, or where it is impractical for the host to ascertain which segments are intermittent. In such situations, it can be advantageous for the responding node to transmit identical messages in both directions of the loop. To be clear, this transmission of a response message from the node actually involves transmission of at least two messages (one from each redundant device performing the communications operation). As such, the node can send multiple response messages back in the opposite direction, or multiple messages in each direction of the loop, as the case may be.

In light of the above examples, it is seen that an energy storage system can include: a host, energy storage modules, a plurality of nodes, and a communications and data transmission medium. Each of the nodes can be implemented at a corresponding one of the energy storage modules and configured to monitor and control that energy storage module. The medium can form a loop from a first portion of the host and sequentially through the nodes to a second portion of the host. In each of the nodes, first and second devices can be configured to perform at least partially redundant communication and data transmission functions using the communications and data transmission medium.

Figure 4:
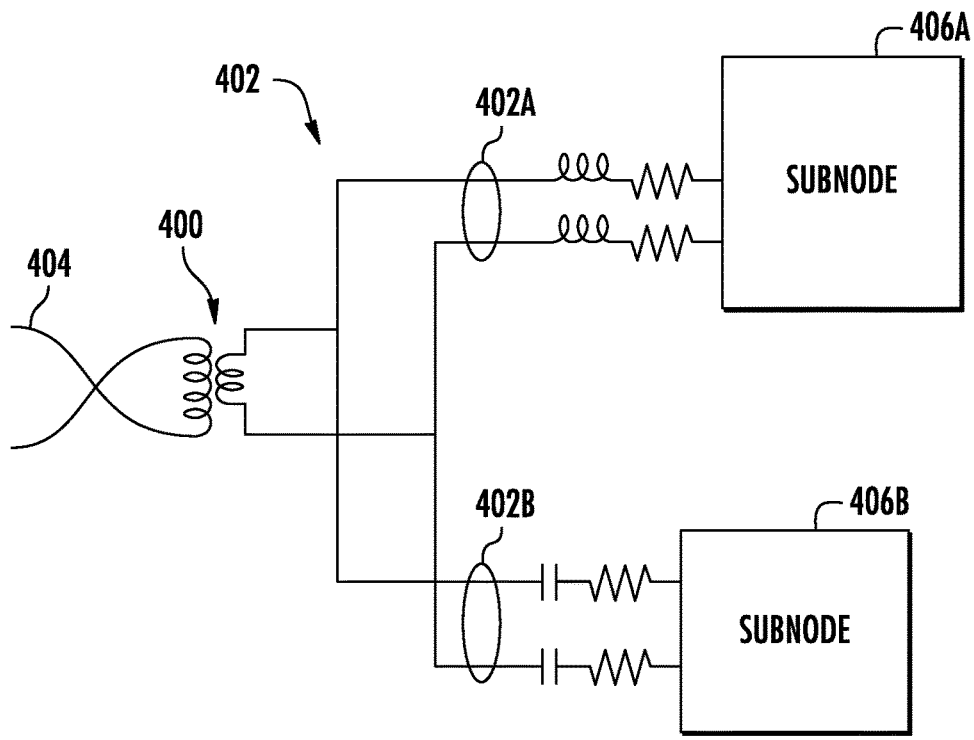
FIG. 4 shows an example of a transformer and a crossover network that can be used with the node structure of FIG. 2.

FIG. 4 shows an example of a transformer 400 and a crossover network 402 that can be used with the node structure of FIG. 2. Connected to the transformer are two conductors 404 that serve as a segment of the communications medium joining nodes to each other. In some implementations, the conductors are a pair of twisted wires that here have their near ends attached to terminals of the transformer 400. The far ends of the conductors, moreover, would be attached to terminals of another node, or of the host. For example, a differential data scheme can be used to encode data as a difference in voltage or current between the conductors.

The transformer 400, then, performs coupling between the physical conductors 404 and the crossover network 402. The crossover network in turn forms at least a lowpass arm 402A to a subnode 406A, and a highpass arm 402B to a subnode 406B. In some implementations, more arms and devices than two can be used in each node. The subnodes 406A-B here represent the two devices that perform partially or completely redundant functions in that node.

The lowpass arm 402A contains resistances and inductances forming a resistance-inductance (RL) circuit. The filter characteristics of the RL circuit correspond to a lowpass filter with a particular transition frequency. Similarly, the highpass arm 402B contains resistances and capacitances forming a resistance-capacitance (RC) circuit having the filter characteristics of a highpass filter with a particular transition frequency. There is no restriction on which of a lowpass arm and a highpass arm connect to a primary or a secondary subnode, when such devices are used. Rather, each subnode uses a communications scheme appropriate for the frequency transmission window available for the corresponding arm of the crossover network.

The characteristics of the RL and RC circuits can be designed based on the particular implementation. However, in some implementations the components are selected so that these circuits have substantially identical transition frequencies. Then, signals well below the transition frequency will be routed primarily into the lowpass arm, and signals well above the transition frequency will be routed primarily into the highpass arm. Signals near the transition frequency will be split between the two arms in a proportion that reflects the ratio of the filter conductances at that frequency. In implementations with substantially identical transition frequencies, and particularly those that have substantially identical resistances, the load placed on the transformer will be substantially frequency independent. For example, this can be advantageous where the transformer is used to match this effectively constant load to the characteristic impedance of the transmission medium segment. In particular, such matching can facilitate electrical reflection suppression in the transmission medium.

The illustrated crossover network 402 has the resistors in series between the signal transmitter and the communications medium segment for both the lowpass and highpass arms, thus serving as series termination resistors. Also, in some implementations the signal transmitted on the lowpass arm 402A has substantially no DC signal power component. This arrangement can suppress reflections on the medium and also limit the maximum current flow that can be caused in the transformer by any DC voltage produced by the transmitter. For example, such voltage can be continuous and unintentionally created, or intentionally created and of transient duration. In some implementations, the resistances and the drive voltage available to the transmitter are chosen to select a maximum current less than the transformer saturation current. This can eliminate the possibility of magnetic saturation of the transformer and thus help satisfy a requirement that malfunction of a given subnode should not disrupt communications for the other subnode.

Other passive networks than a single pole RL-RC crossover can be used, including, but not limited to, surface and bulk acoustic wave filters, transmission line filters, dielectric resonators, micro-electro-mechanical system filters, and the like.

Figure 5:
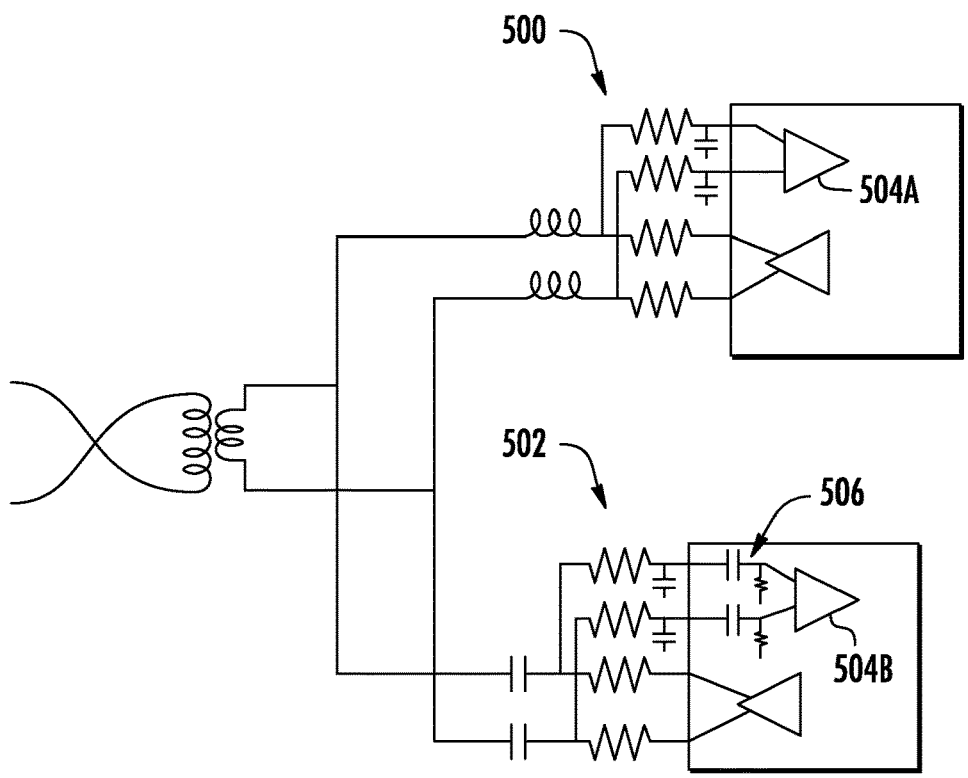
FIG. 5 shows an example of receiver signal paths that can be used in the crossover network of FIG. 4.

FIG. 5 shows an example of receiver signal paths that can be used in the crossover network of FIG. 4. With the illustrated series termination, auxiliary connections 500 and 502 can be used to detect received signal voltage. While a signal receiver that is sensitive to current could be used to detect the current signal conducted through the crossover network, such receivers may be less readily available, and less convenient, than voltage sensitive receivers. As such, the auxiliary connections 500 and 502 can form secondary paths to conduct a signal voltage to respective voltage sensitive receivers 504A-B in the subnodes. For example, such paths can conduct a signal voltage proportional to the conducted signal current, with a constant of proportionality set by the termination resistor.

In the illustrated example, each of the auxiliary connections has a series resistor followed by a shunt capacitor so as to form an RC lowpass filter. This can increase the system's ability to reject high-frequency interference. For the lowpass arm, the frequency of this RC receive filter can be set near or below the transition frequency of the crossover network, which can help reject any signal from the highpass arm leaking into the lowpass arm.

For the highpass arm, moreover, the RC filter cutoff frequency should be set high enough to conduct a sufficient portion of the signal power generated by the corresponding transmission scheme to enable reliable reception. In some implementations, an additional RC highpass filter 506 can be used in the receive signal path of the highpass arm. For example, this can help reject low frequency signals from the lowpass arm leaking into the highpass arm. Such a highpass filter can have a cutoff frequency near the transition frequency of the crossover network.

Some of the above description focuses on the receiver signal path. The subnode also includes a transmitter path that serves to generate outgoing signals from the subnode, for receipt by the host or another node. The host, moreover, will have suitable receiver and transmitter components, which in some implementations are similar to those of the subnode. Particularly, the host can have two separate points of connection to respective ends of the bus, and can select any of these for transmission so as to produce signals in either a clockwise or counterclockwise direction in the loop.

Circuitry described herein can be implemented in any of multiple suitable ways depending on the characteristics of the application. In some implementations, the subnodes are integrated circuits, either separately with one integrated circuit comprising the P subnode and another comprising the S subnode, or one integrated circuit can comprise both (or several) subnodes. In such implementations, the lowpass filter stages and termination resistors can be located outside the integrated circuits, and any highpass filters can be located inside the integrated circuits. For example, this can be advantageous from a chip packaging and electrostatic discharge perspective. Moreover, any parasitic capacitance to ground or to adjacent pins that the packaging adds can by design be incorporated into the shunt capacitor of the lowpass filter. From the electrostatic discharge perspective, incorporating series resistive elements into each circuit path leading to the integrated circuit can help protect the circuit from discharge-induced currents. As another example, it can allow voltage clamping devices placed between the transformer-associated portions of the circuit and local ground to share a larger portion of any discharge current by increasing the impedance seen along the sensitive paths leading to the integrated circuit. Other distributions of components inside versus outside an integrated circuit can be used.

While signal distortion can be a problem no matter where it occurs in the system, it can be more difficult to maintain distortion-free signaling in the highpass arm of the filter network due to the higher signaling frequencies required by its communications scheme. For example, the highpass and lowpass responses of this arm, combined with the additional potential for signal reflection in the communications medium segment at high frequencies, can cause significant amplitude alteration and phase shift of the component frequencies.

A signaling scheme can therefore be used that is substantially insensitive to phase shifts and frequency-dependent amplitude alteration. In some implementations, a frequency shift keying (FSK) scheme can be used, where a signal with frequency content far below the frequency of the lower of the FSK carriers is used to modulate the portion transmitted of each of two FSK carriers. For example, such a scheme can have the signal in form of a binary data stream, so that entirely one carrier or entirely the other carrier is transmitted.

In some implementations, Manchester encoding is used to generate the binary data stream to be transmitted. For example, this can allow for reasonably simple detection of a valid signal and rejection of invalid signals. In the present Manchester encoding, a valid signal can be preceded by a special synchronization sequence that can always be detected by the decoder. This synchronization sequence can serve to initialize the timing circuitry of the decoder by providing a known pattern. As another example, the valid pattern can deliberately be preceded by an invalid pattern (that is, one that never appears in a valid packet) so as to re-initialize the decoder to a receptive state in case a noise event had already caused it to start decoding in error. Because Manchester encoding contains an embedded clock and can be received without a great need for timing stability in the receiver, such a communications scheme can also provide for robust decoding of signals whose timing parameters are imprecise or have been altered. As such, the transmission scheme can be tolerant of clock errors.

In some implementations, the choice of FSK modulated Manchester encoding can minimize the hardware requirements driven by the transmission scheme. Assuming that the signal frequency transmitted at a given moment is the strongest frequency component of the signal arriving at the receiver at that moment, the FSK scheme will be immune to many forms of distortion. For example, this can allow the receiver to be chosen without placing excessive constraints on the linearity of the signal path.

Figure 6:
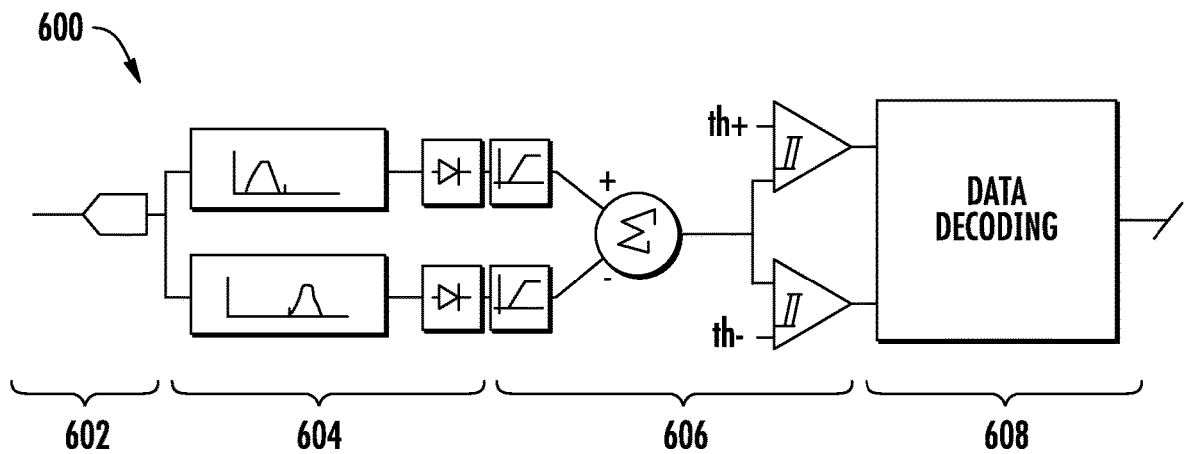
FIG. 6 shows an example of digital signal processing components that can be used in any of the subnodes of FIG. 2.

FIG. 6 shows an example of digital signal processing components 600 that can be used in any of the subnodes of FIG. 2. In general, the digital signal processing components 600 form a quantizer stage 602, a frequency discrimination stage 604, an edge detection stage 606, and a data decoding stage 608. Because the highpass arm can be particularly susceptible to distortion, the components 600 will be described as being implemented on that arm. However, a similar or identical scheme can be used with the lowpass arm.

The quantizer stage 602 can form the first stage of the receiver. In some implementations, a zero-crossing detector can be used, which can equivalently be called a 1-bit quantizer. For example, such a quantizer is relatively simple and thus will cost little. Also, the power consumption requirements of the receiver can remain low if the quantizer is the only analog circuitry in the entire receiver design. By contrast, the quantizer can be followed by a series of digital signal processing units that extract the data from the signal.

In operation, the 1-bit quantizer is clocked to produce a series of binary samples at some multiple of the received signal frequencies. In some implementations, the received signal is sampled at approximately four times the average signal frequency, for example to minimize cost and design complexity. This can also provide other useful simplifications of the digital signal processing logic as will be described below.

The frequency discrimination stage 604 here produces two signals that represent the signal power received in two bands, each of them centered on one of the two FSK carrier frequencies.

The edge detection stage 606, in turn, accumulates the information contained in these in-band power signals over a period of time to detect a transition of the received signal power from one frequency band to the other, or vice versa. According to Manchester encoding, a transition of the received signal from one band to the other corresponds to a digital transition of the transmitted data stream. Here, the edge detection stage produces two outputs, one encoding transitions from a first FSK carrier to a second one, and the other from the second carrier to the first one.

The data decoding stage 608, finally, can apply usual forms of state-machine and timer based logic to the signal to decode the Manchester encoding and generate a data stream corresponding to the transmitted data. In some implementations, appropriate modifications are made to accommodate the form of the signal produced by the frequency discrimination stage. For example, this can involve detection of edges rather than logic levels as is often done in serial receivers.

Figure 7A:
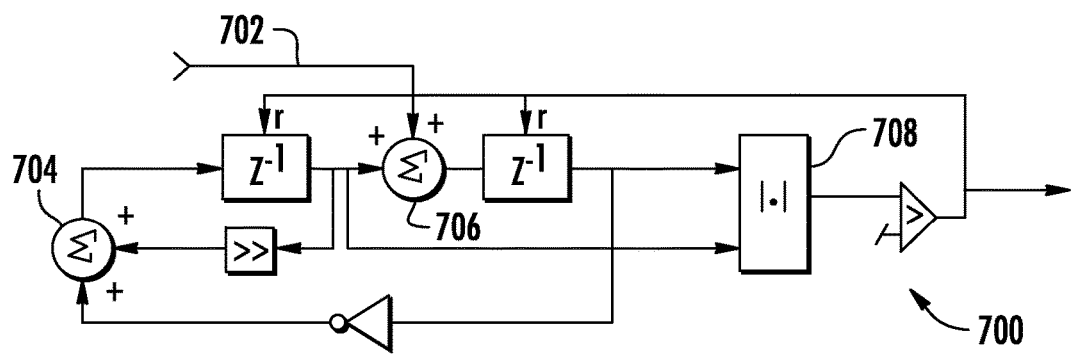
FIG. 7A shows an example of a filter block that can be used for frequency discrimination in any of the subnodes of FIG. 2.

FIG. 7A shows an example of a filter block 700 that can be used for frequency discrimination in any of the subnodes of FIG. 2. Registers labeled $z^{-1}$ represent a one-sample delay of a signal. This can be implemented as a sequential logic element, for example a flip-flop. Adders are labeled with a summation symbol. For example, the adder can be a two's complement binary adder of finite arithmetic precision. This block can provide an infinite impulse response filter with an undamped, sinusoidal impulse response. As such, it can be characterized by a constant k that defines the response frequency of the filter. For example, when k=0, the filter response is centered at one fourth of the sampling frequency. For this reason, the sampling frequency can be chosen as four times the signal frequency.

The filter block 700 provides reduced logic element speed requirements for a given sample processing speed frequency. For example, the filter uses a fixed-point binary representation of the signal with finite bit width. The filter makes no special attempt to preserve the phase of the received signal component, because amplitude can be considered more important. As such, the filter can integrate the signal over a variable period until sufficient signal energy has been accumulated to cross a threshold, and produce a discrete output when this event occurs. As another example, the frequency response of the filter can be chosen to minimize hardware complexity rather than to achieve a specific frequency response. The transmitted signal will then be tailored to the selected filter frequency.

A signal 702 is fed into the filter block. For example, this can be in form of a one-bit wide data stream that is padded to the width of the data bus. The filter block has an adder 704 that is part of a feedback loop in the filter. However, the signal is not added to the values in the datapath using that adder. Instead, an adder 706 is provided between the two delay registers. That is, because real digital adders do not automatically accept more than two inputs without additional complexity, this position of the signal injection simplifies the logic that is present between any two registers. Moreover, because the ultimate speed of a synchronous digital circuit—or equivalently, the amount of engineering and process expense necessary to achieve a given target speed—depends on the longest delay between subsequent register stages, this approach furthers a design goal of obtaining reasonable speed with inexpensive logic.

Also, the signal is represented in the chosen two's complement sign representation of the system by the values 0 and 1, as opposed to, say, the values −1 and 1. For example, this can eliminate a sign extension step that would be necessary to extend the 1-bit wide data onto the m-bit wide data bus. This representation entails an effective addition of a DC offset to the signal. However, the filter response to a DC signal is a constant output, whereas its response to a signal of the selected frequency is a constantly rising sine wave of the same selected frequency. Unlike the selected frequency, therefore, the offset is not integrated and can be compensated for by appropriate selection of the detector threshold that follows the filter loop. As another example, a sufficiently small offset can be ignored.

In this example, the operation of negating the output of the second delay register before applying it to the first delay register is replaced by logical complementation. Arithmetic negation of a signal x in two's complement arithmetic is normally effected by the operation −x=NOT(x)+1. In some implementations, however, the operation of +1 is omitted, which can allow an entire computationally expensive carry chain to be removed from the design. Similar to the above example, this can effectively add a DC offset to the system, this time to the unperturbed output of the filter. Such offset can be compensated for or ignored.

Referring again to the constant k, its values can be selected to have the form $+/-2^q$, where q is an integer. For filter frequencies close to one fourth of the sampling frequency, the value of k is less than one. Selecting k in this way can allow the gain block k to be realized as a simple bit-shift. In a bit-parallel data path such as this one, a bit-shift can be implemented as a simple alteration of wiring connections. Moreover, if k is selected such that q is a negative integer, this bit shift can be accomplished without truncation of the most significant bits of the shifted value.

Figure 7B:
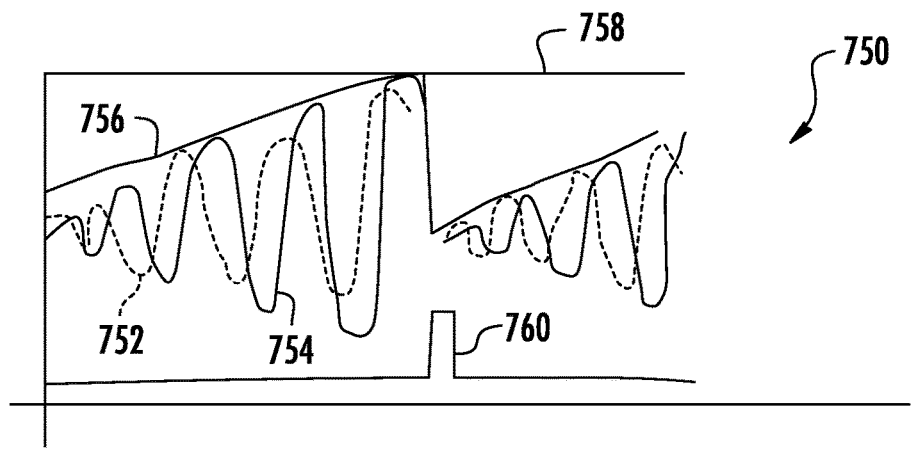
FIG. 7B shows an example of a graph presenting entities in the filter block of FIG. 7A.

Turning now to FIG. 7B, it shows an example of a graph presenting entities 750 in the filter block of FIG. 7A. Particularly, the in-band component of the input signal is integrated over multiple samples by the delay register acting in conjunction with the feedback path formed from the output of each register. This causes the amplitude of the integrated in-band component of the signal to increase, for example as represented by superimposed traces 752 and 754. A Cartesian norm detector 708 (FIG. 7A) generates an output 756 that also increases with the traces 752-54. The Cartesian norm of two signals x and y can be defined as the square root $sqrt(x^2+y^2)$, which is also the length of a vector (x,y) in the Cartesian plane. The signal energy accumulated by the filter can be properly calculated as $sqrt(x^2+kxy+y^2)$. While the Cartesian norm is not a numerically correct representation of the signal energy, this error can be negligible in the application.

A threshold 758 is defined. When the output 756, approximately representing the accumulated energy, passes this threshold, the contents of the delay registers can be set to zero. Here, that event is represented by a reset signal 760 that causes the filter to be set to a repeatable initial state. In FIG. 7A, the reset signal is labeled r. After this, the process can begin anew. Moreover, the rate at which the reset signal is activated is approximately proportional to the input signal amplitude, and thus the reset signal can be treated as a pulse density modulated representation of the approximate signal power in the input band selected by the filter.

Figure 8:
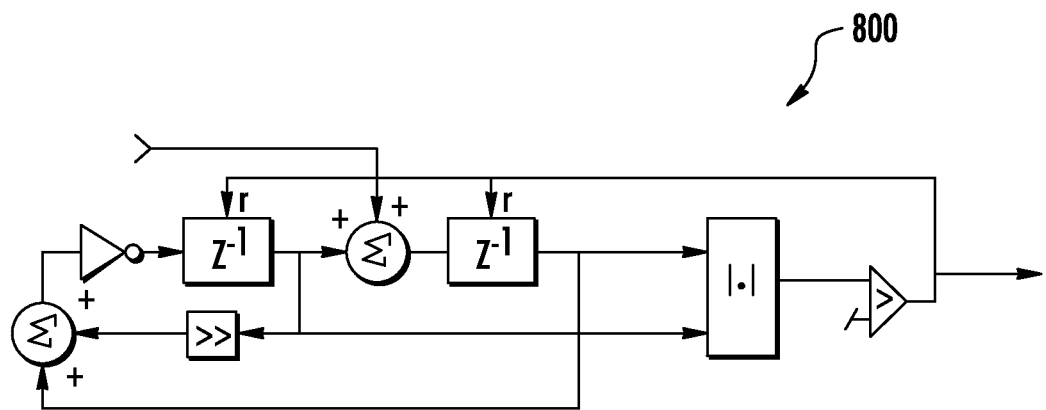
FIG. 8 shows an example of another filter block that can be used for frequency discrimination in any of the subnodes of FIG. 2.

The datapath can be slightly modified for negative k values. FIG. 8 shows an example of another filter block 800 that can be used for frequency discrimination in any of the subnodes of FIG. 2. Similar to the preceding description, the actual realization of the k value is still a bit shift, which does not negate the value. However, the numerical complementation operation that was previously used to approximately negate the output of the second register before feeding back to the first register is now applied after the summation of the second register output with the output of the k block. In this figure and in FIG. 7A, the k block has been replaced with a >> symbol to represent a right-hand bit shift. In other respects, the filter block 800 has similar components to the filter block described above.

To illustrate another example of a simplification, it can be noted that the error discussed regarding the use of the Cartesian norm to calculate the integrated power stored in the filter, which is proportional to kxy, is periodic and vanishes at those times when either x or y is zero. Analysis of filter response to a small input signal shows that the signal energy rotates between the two registers at a rate $\omega_0-\omega_s$, where $\omega_0$ is the filter center frequency and $\omega_s=f_s/4$ is one quarter of the sampling frequency. This "precession" causes the signal energy to occasionally appear almost entirely in one delay register or the other. During these times, not only is $sqrt(x^2+y^2)$ a perfect representation of the signal energy, but so is $|x|+|y|$ and even $Max(|x|, |y|)$. If the system guarantees that the signal precession occurs sufficiently quickly, it can continuously compute the function $|x|+|y|$ or $Max(|x|,|y|)$, and execute the threshold comparison on this value instead of $sqrt(x^2+y^2)$. That is, the system can trigger its reset signal soon after the time when a numerically correct signal energy would have triggered it, with that delay being proportional to $1/(\omega_0-\omega_s)$.

In some implementations, therefore, $Max(|x|,|y|)$ is chosen as the approximate representation of the integrated signal energy, a small negative number is chosen for q to set k so that $1/(\omega_0-\omega_s)$ is small, and the threshold to which $Max(|x|,|y|)$ is compared is set to a constant of approximately the form $2^t$. If the bus width of the logic is m bits, the m need not normally exceed t, since no numbers of higher precision need to be represented except during the sample period where $Max(|x|, |y|)$ does in fact exceed $2^t$. For example, if a threshold greater than or equal to 16 is chosen, the system need not use more than four bits of precision in the data bus. Only on the sample at which either x or y exceeds 15 would another bit of precision be necessary. At this point in time, however, the system is on the verge of resetting the delay registers, so it need not retain the extra bit necessary to faithfully represent the number 16. Rather, if the system detects when the number 16 is about to be produced, it can in fact discard the fifth bit before generating it.

In some implementations, a convenient way of detecting this occurrence exists because adder hardware with signed overflow detection is used to implement the sum blocks of the filter. When such an adder overflows, this indicates that the sum exceeds $2^{m-1}-1$ (or is less than $2^{m-1}$), where m is the adder input width. When adders that detect numerical overflow are implemented, therefore, the overflow signals from the two adders are combined by logical OR to provide a signal that represents the function $Max(x,y)>2^m-1$ OR $Min(x,y)<-2^m$. In such implementations, the results of the filter using this threshold detection scheme can be sufficiently close to the numerically correct $sqrt(x^2+kxy+y^2)$ that the logically simpler scheme can be used without great loss of filter fidelity.

Figure 9:
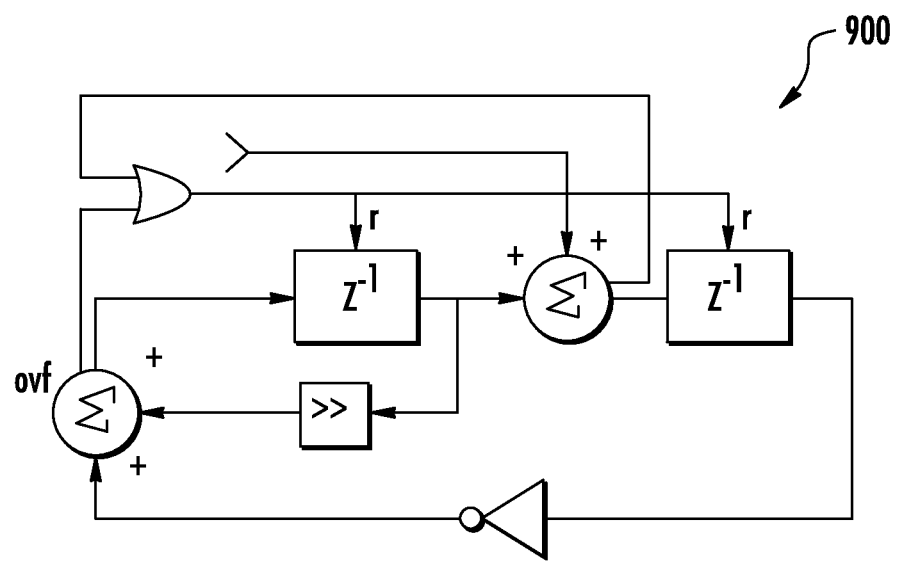
FIG. 9 shows an example of a filter block and a reset signal.

FIG. 9 shows an example of a filter block 900 and a reset signal. This can be considered a logically simplified filter scheme for a positive k value. The reset signal, labeled r, is the result of the threshold comparison, and here also serves as the filter output. In implementations of a filter with a negative k value, on the other hand, the logical complementation can be performed after the first adder, for example as illustrated in FIG. 8 discussed above.

In some implementations, the output of the filter is not a linear function of input power. Rather, for a filter stimulated with a small signal near but not equal to the center frequency of the filter, below some signal power threshold, the integrated signal energy will increase, reach a peak, and decrease back to zero without crossing the detection threshold. For very large signals, on the other hand, the output of the filter will increase in an approximately linear fashion until it crosses the threshold. For smaller signals that just barely cause the integrated signal energy to cross the threshold, the dependence of output pulse stream density on signal power is rather nonlinear. However, for reasonable received signal levels and interference levels, the transmission scheme is not sensitive to this nonlinearity.

Concluding the discussion of frequency detection, it is noted that the peak integrated signal energy reached by the filter as the result of a given input is proportional to both frequency offset and input amplitude, so the effective bandwidth of the filter is a function of input amplitude. This bandwidth is very narrow for very small input signals. For larger input signals, on the other hand, the bandwidth is greater. The filter can therefore appropriately be used for detecting input signals that are either very close to the center frequency of the filter, or that have sufficient amplitude.

That is, two filters were used in this example, each tuned to one of the respective FSK carrier frequencies. The difference in the outputs of these two filters then represents a shift in energy from one band to the other.

Once the signal component in each filter band has been detected, the edge detection stage 606 (FIG. 6) should then detect this shift of signal energy. This can be done by convolving an impulse response representing a highpass function with each of the pulse density streams generated by the filters. Alternatively, the pulse streams from the frequency discrimination stage can be combined before being fed to a highpass filter, wherein pulses from one of the frequency discrimination filters are given a weight of 1, and pulses from the other filter are given a weight of −1.

Figure 10:
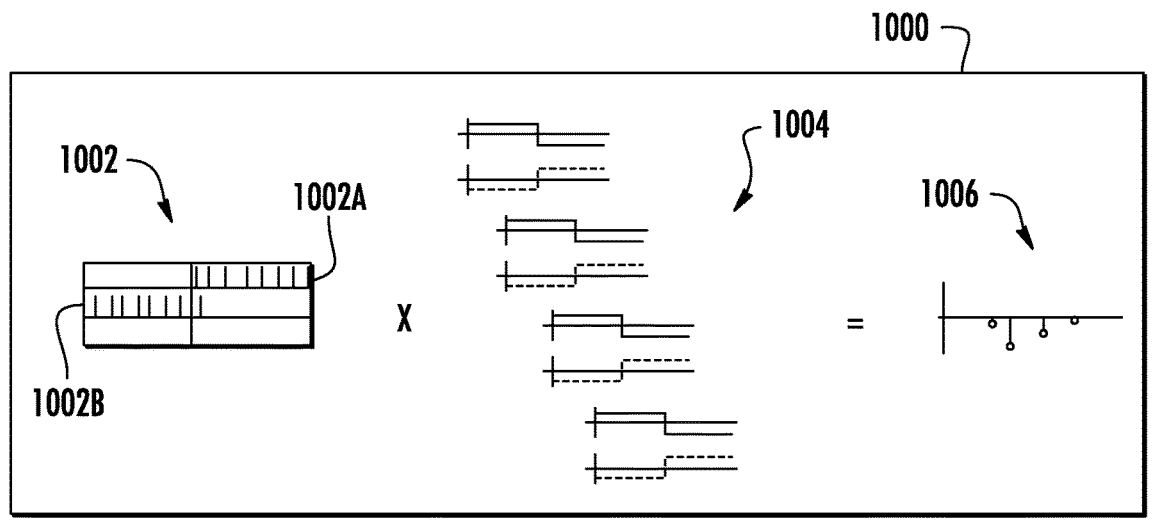
FIG. 10 conceptually shows an example of an integrate-and-dump implementation of a down-sampled convolution.

FIG. 10 conceptually shows an example of an integrate-and-dump implementation 1000 of a down-sampled convolution. Schematically illustrated are pulse density streams 1002, an impulse response 1004, and a result 1006. That is, the impulse response 1004 is being convolved with the pulse density streams 1002 to produce the result 1006.

The illustrated example will now be described in more detail. Actual convolution is very computationally expensive. Some implementations can therefore use an approximation of the convolution operation to produce usable results. A first aspect of approximation is selecting a bipolar, rectangular impulse response whose values are all either −1 or 1. The impulse response 1004 shows one such example. This approach can simplify the convolution operation by substituting a simple conditional sign change operation for the sample-by-sample multiplication that may otherwise be required. A second aspect of approximation is to down-sample the data stream as the convolution is computed, such that output samples are only produced at four times the rate of the convolution kernel. That is, the convolution in the implementation 1000 here actually comprises four overlapping integrate and dump operations, as shown for the impulse response 1004. The operations are performed in four independent signal paths operating with a pi/2 kernel phase offset from each other.

A third aspect of approximation relates to the input data stream that the convolution is processing. Due to the integrate and dump nature of the digital filters, there is a maximum rate at which pulses 1002A-B are produced in the pulse density coded output streams. This rate may be much less than the system clock rate, and is of the same order as the threshold value $2^t$ used to set the filter sensitivity and bandwidth. This means that as long as the system can process one round of accumulation in the four integrate and dump blocks of the detector at a rate faster than the arrival rate of input pulses, the system need not process a number greater than +1 or less than −1.

Figure 11:
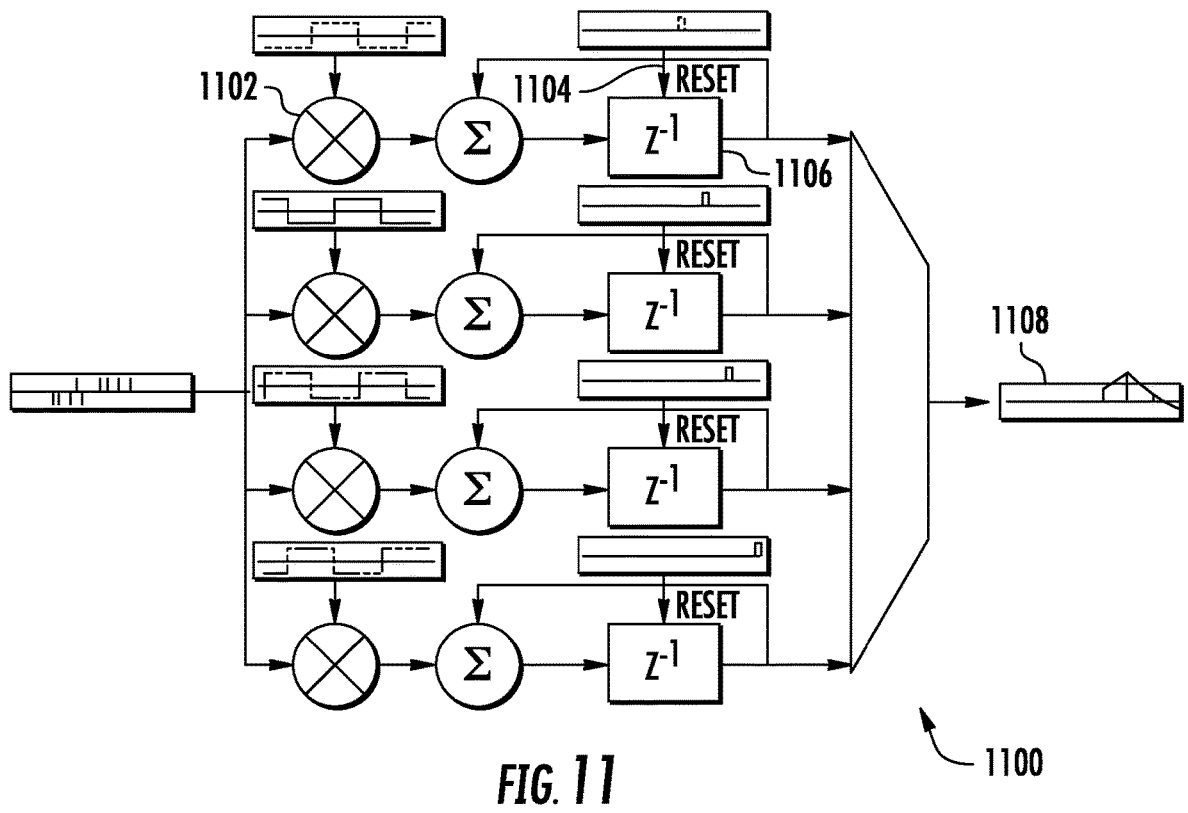
FIG. 11 shows an example of a convolution operation for an edge detector.

FIG. 11 shows an example of a convolution operation 1100 for an edge detector. Particularly, this illustrates an example of four interleaved integrate and dump operations that implement the convolution functionality. Here, multiplication operations 1102 are shown rather than the sign inversion operation, for clarity. When each reset pulse 1104 is activated, the corresponding register 1106 is zeroed. At the same time, the contents of the register before zeroing are also selected as an output sample. Because of the four interleaved operations, the phase delay between the kernel and an input signal transition will be at most a one-eighth kernel period. An error in output 1108 due to misalignment between the actual edge of the input stream and the best aligned interleaved phase is therefore at most 25%.

A bit serial arithmetic unit can be implemented to execute the four parallel integrate and dump operations. This can have several implications for the construction and operation of the circuit. For example, bit serial arithmetic units tend to involve less hardware, as only one bit needs to be processed at a time. As another example, carry chains and multiplexing of registers or duplicated arithmetic logic unit (ALU) logic can be eliminated.

The shift register that stores the state of the accumulators can be implemented as a series of dynamic flip-flops or latches. For example, if the shift register is always clocked at a nominal main clock rate, dynamic logic can be attractive because refresh times are easily met even under severe operating conditions. In other cases, however, a parallel implementation of the same logic can be used. Because registers can be operated on at one quarter of the clock rate, they too can be implemented as dynamic logic. Transmission-gate-based multiplexing could then be used to route the appropriate register to the ALU. Alternatively, static random-access memory (SRAM) cells could be used and be updated with a single-register-width bank of dynamic flip-flops which stores the result before re-loading the register cells. Such schemes can afford simplified timing logic. For example, the SRAM-based approach can result in a smaller bit storage cell than is needed for the bit serial shift register.

Some examples will now be discussed with reference to a datapath and timing generation shown in FIGS. 12A-C. In these figures, all lines are 1-bit wide unless otherwise noted with a slash symbol and a bit width label. The datapath here comprises essentially three components that are discussed in turn.

Figures 12A, 12B, 12C:
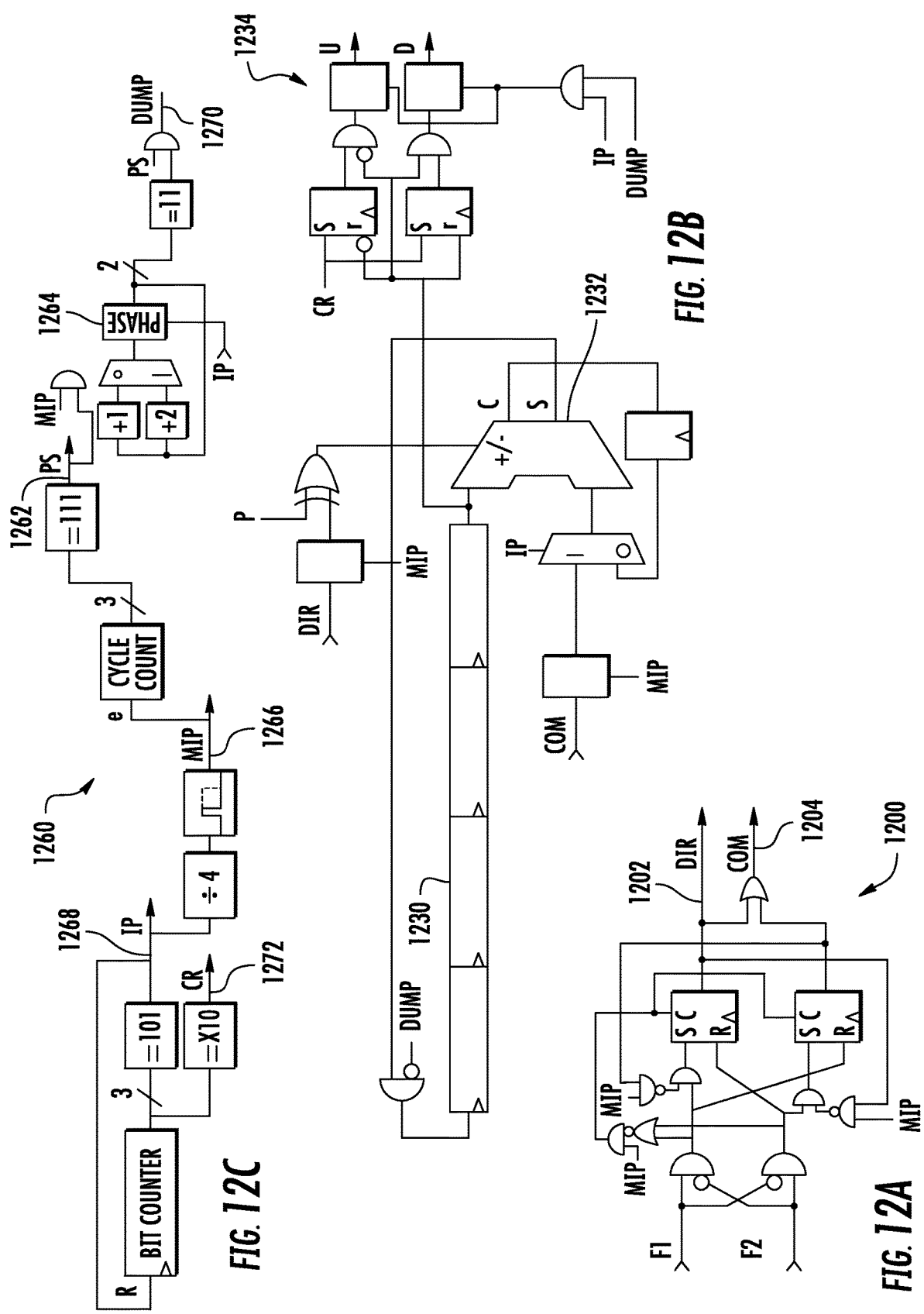
FIG. 12A shows an example of a latching block that can be used with edge detection in a datapath of any of the subnodes of FIG. 2.
FIG. 12B shows an example of an accumulator register set, an ALU and a comparison block that can be used with edge detection in a datapath of any of the subnodes of FIG. 2.
FIG. 12C shows an example of timing logic that can be used with edge detection in a datapath of any of the subnodes of FIG. 2.

FIG. 12A shows an example of a latching block 1200 that can be used with edge detection in a datapath of any of the subnodes of FIG. 2. The input latch takes the two pulse streams (F1,F2) from the frequency discrimination filters and latches them for the duration of one processing period. For example, this can be the time that it takes to clock all of the accumulator bits through the ALU. Here, the F1 stream is given a weight of +1, and the F2 pulse stream is given a weight of −1. During the processing period, the net number of weighted pulses received is accumulated, to a maximum of +1 and a minimum of −1.

One output of the latching block is a direction signal 1202 (labeled DIR) that is true for an input value of 1, false for an input value of −1, and false for an input value of 0. Another output of the latching block is an increment decrement command signal 1204 (labeled COM) that is true if either a +1 or −1 is present, and false otherwise.

FIG. 12B shows an example of an accumulator register set 1230, an ALU 1232 and a comparison block 1234 that can be used with edge detection in a datapath of any of the subnodes of FIG. 2. These can be driven by the outputs of the latching block and other signals.

Here, the accumulator registers are illustrated as four concatenated shift registers. In some implementations, this can be a single 24-bit shift-register containing the four 6-bit accumulator words represented by $z^{-1}$ (e.g., FIG. 9). The system then acts on these registers sequentially rather than simultaneously. Moreover, the block accepts only at most one net input pulse from the pulse density streams during the time it takes to process the whole 24-bit shift register. If a positive input pulse arrives from the filters, it is latched for the processing interval and stored until the beginning of the next interval, at which point it is added or subtracted as necessary from the four accumulator registers. If a negative impulse arrives as well before the beginning of the next processing interval, the positive pulse is annulled and no action takes place during the next processing interval. In this way, only the input values 0, +1 or −1 can be processed during a given processing interval.

Turning now to the ALU 1232, it will either increment or decrement each register contents as it passes through the ALU if a pulse was received. Whether the register contents are incremented or decremented depends on the weight of the input received, and on whether the register is accumulating data during the first (negative) half of the convolution impulse response associated with that accumulator, or the second (positive) half of the impulse response. Here, the current half of the impulse response is denoted by a signal labeled P. During the first half of each register's impulse response accumulation period the signal P is true, and during the second half it is false.

The comparison block 1234, in turn, executes a signed comparison of the accumulated value in each register with respect to a positive and a negative round number binary threshold. For example, this can be done by computing a Boolean OR (NAND) of all bits with weight greater than or equal to a number b, where $2^b$ is the positive (negative) threshold of comparison. The sign bit can then be interrogated appropriately whether the sign of the compared value agrees with the sign of the threshold. This comparison is executed on every word as it leaves the accumulator shift register. On those processing periods where the word is to be reset (having completed accumulation of input pulses for one impulse response period), the result of the comparison is latched into the appropriate output labeled U or D. That is, these outputs signal the presence of an "Up" (F2 to F1) or "Down" (F1 to F2) signal transition.

Finally, examples of signals that can be used in the logic described above will be discussed. FIG. 12C shows an example of timing logic 1260 that can be used with edge detection in a datapath of any of the subnodes of FIG. 2. The boxes denote multi-bit counters where the output line shows a bit-width label.

The comparison latch event described above occurs every quarter of an impulse response period. Each quarter of an impulse response period is signaled by the occurrence of a phase skip signal 1262 (labeled PS). The PS signal also rotates the phase of a two-bit counter 1264 (labeled Phase) by one count. The Phase counter, which increments at the rate at which 6-bit registers pass through the datapath, tracks which phase of the impulse response accumulation cycle each register is currently executing. Here, the four accumulators are each in a different kernel phase at any given point in time, and the kernel precesses at the PS pulse rate. The Phase counter is therefore here advanced by two sources: During most input sample processing routines, it increments synchronously with a master index pulse (described below); the master index pulse always finds Phase in the same phase, as do each of the accumulator word computations. On the PS cycles, however, which mark kernel phase edges, the Phase increments by two rather than one and subsequent mater index pulses find Phase at a new phase. Also, each accumulator word now finds the phase advanced by one, and is thus treated appropriately for the new kernel phase with which the input samples are to be convolved. The Phase counter overflows once every 24-bit data processing period.

The accumulator register that the ALU happens to be operating on during the 6-bit before the Phase overflow (that is, when Phase equals binary 11) is the register that will be selected for comparison to the integration threshold and for resetting. This selection happens at a rate of four times the impulse period, and because the Phase counter rotates through four possible phase offsets with respect to the 24-bit data flow before re-aligning with a given accumulator word, each word is compared to the thresholds and simultaneously reset once every impulse response period, as is required by an integrate and dump operation over that period.

The timing logic 1260 generates a master index pulse 1266 (labeled MIP) at the rate of once per 24-bit data processing period. The MIP signals to the input latch circuitry that the net number of weighted input pulses should be transferred to the datapath latches and that the input latches should be reset. More particularly, the MIP precedes the clock cycles during which the accumulator contents are word-aligned with the accumulator word positions. Any register contents that need to be set for the subsequent input sample processing routine (which spans the four accumulator word computations that follow) are latched at the end of this clock cycle.

The timing logic generates an index pulse 1268 (labeled IP) every 6-bit word processing period. The IP denotes word boundaries and signals that the carry latch in the ALU should be reset to receive a new word. More particularly, the IP precedes the clock cycle during which accumulator words are bit-aligned with accumulator word boundaries. It is also used to transfer the comparison result into the output signal latches on those 6-bit processing cycles where an accumulation is finalized, as signaled by a dump signal 1270.

The dump signal 1270 occurs once every fourth of an impulse response processing period. It signals that one of the four accumulator registers, indexed by Phase, should be compared to the integration threshold. It also forces a clear of the accumulator in question, readying it for the next complete kernel operation.

A compare reset signal 1272 (labeled CR) is used to set the integration threshold. Because data words are processed least-significant bit first, the CR signal is used to hold the result of the compare latch "true" until the first significant bit (that is, the first bit whose weight is enough to exceed the integration threshold) is presented.

A cycle counter is used to produce the PS signal using the MIP, wherein the PS signal is high for the duration of the input sample processing routine that precedes convolution kernel edges. At a kernel edge, the polarity with which input samples are added to or subtracted from the accumulators is changed based on the accumulator number and the phase of the present kernel. The PS signal 1262 occurs once every fourth of an impulse response period and advances the phase counter to align with a new accumulator register. This phase shifting operation is used to track the part of the impulse response being accumulated into each accumulator register and to select the register to be dumped by.

The P signal is here the inverse of the most significant bit of the Phase register 1264.

A number of implementations have been described as examples. Nevertheless, other implementations are covered by the following claims.

What is claimed is:

1. An energy storage system comprising:
a host;
energy storage modules;
a plurality of nodes, each implemented at a corresponding one of the energy storage modules and configured to monitor and control operation of the corresponding energy storage module;
a communications and data transmission medium forming a loop from a first portion of the host and sequentially through the nodes to a second portion of the host; and
in each of the nodes, a first device and a second device configured to perform at least partially redundant communication and data transmission functions using the communications and data transmission medium, the first device and the second device further configured to perform at least partially redundant monitoring or measurement functions on the corresponding energy storage module,
wherein the communications and data transmission medium connects to the plurality of nodes via transformer coupling and frequency division multiplexing, wherein the frequency division multiplexing is performed by respective crossover circuits in the nodes, each crossover circuit comprising a lowpass arm associated with the first device and a highpass arm associated with the second device.

2. The energy storage system of claim 1, wherein the first device and the second device perform fully redundant communication and data transmission functions.

3. The energy storage system of claim 1, wherein the communication and data transmission functions performed by the second device have reduced accuracy compared to the communication and data transmission functions performed by the first device.

4. The energy storage system of claim 1, wherein the first device and the second device perform fully redundant monitoring or measurement functions on-the the corresponding energy storage module.

5. The energy storage system of claim 1, wherein the communications and data transmission medium consists of two physical conductors and wherein communications and data transmission are performed over the two physical conductors with a differential data scheme.

6. The energy storage system of claim 1, wherein the crossover circuit being a passive crossover circuit comprising the lowpass arm with an RL circuit which routes communications to the first device, and the highpass arm with an RC circuit which routes communications to the second device, and wherein the transformer coupling comprises a magnetic transformer between the communications and data transmission medium and the passive crossover circuit.

7. The energy storage system of claim 6, wherein the passive crossover circuit further comprises a respective secondary lowpass filter path on each of the RL and RC circuits, each secondary lowpass filter path comprising a series resistor and a shunt capacitor.

8. The energy storage system of claim 7, further comprising an RC highpass filter in the secondary lowpass filter path of the highpass arm.

9. The energy storage system of claim 8, wherein each of the nodes includes at least one integrated circuit in which the first device and the second device are implemented, wherein the RL and RC circuits and the secondary lowpass filter paths are positioned outside the at least one integrated circuit, and wherein the RC highpass filter is part of the at least one integrated circuit.

10. The energy storage system of claim 6, wherein a frequency shift keyed signal is transmitted at least in the highpass arm, wherein each of the nodes includes a frequency discrimination circuit configured to discriminate between components of the frequency shift keyed signal, wherein the frequency discrimination circuit forms a datapath that includes at least two one-sample delay registers and a feedback loop having a first adder, and wherein the frequency shift keyed signal is added to the datapath with a second adder positioned between the two one-sample delay registers.

11. The energy storage system of claim 10, wherein the frequency discrimination circuit includes a negation in the datapath, wherein the frequency shift keyed signal is represented using a two's complement sign representation in which arithmetic negation of a signal (x) is effected by: $-x=NOT(x)+1$, and wherein the frequency discrimination circuit omits the +1 operation in performing the negation.

12. The energy storage system of claim 10, wherein the frequency discrimination circuit has a response frequency defined by a constant k in a gain block such that k=0 centers the response frequency at one fourth of a sampling frequency of the frequency shift keyed signal.

13. The energy storage system of claim 12, wherein the constant k for the frequency discrimination circuit is selected as $+/-2^q$, where q is an integer, wherein the frequency discrimination circuit has an alteration of wiring connections that implements a bit-shift representing the gain block.

14. The energy storage system of claim 12, wherein for negative values of the constant k, the frequency discrimination circuit includes a negation operation after the adder in the feedback loop.

15. The energy storage system of claim 10, wherein the frequency discrimination circuit includes a norm detector block generating an output that represents energy accumulation by the frequency discrimination circuit, and wherein when the output exceeds a threshold, the frequency discrimination circuit resets the one-sample delay registers.

16. The energy storage system of claim 15, wherein each of the first adder and the second adder has signed overflow detection, wherein the frequency discrimination circuit performs threshold detection through combination by logical OR of respective overflow signals from the first adder and the second adder.

17. The energy storage system of claim 10, wherein the frequency discrimination circuit includes a latching block configured to latch frequency discriminated pulse streams, and an accumulator register set and an ALU, wherein the latching block generates for the accumulator register set and the ALU (i) a direction signal that is true for an input value of 1, false for an input value of −1, and false for an input value of 0, and (ii) an increment decrement command signal that is true if either a 1 or −1 is present, and 0 otherwise.

18. The energy storage system of claim 1, wherein the first device and the second device receive respective first and second signal components, wherein each of the nodes implements at least one edge detector for detecting a shift of signal energy, the edge detector configured to perform convolution on a pulse density stream with a bipolar, rectangular impulse response whose values are either −1 or 1 such that the convolution involves a conditional sign change operation.

19. The energy storage system of claim 1, wherein each crossover circuit is an active crossover circuit.

20. An energy storage system comprising:
a host;
a plurality of energy storage modules;
a plurality of nodes, each implemented at a corresponding one of the energy storage modules and configured to monitor and control that energy storage module;
a communications and data transmission medium forming a loop from a first portion of the host and sequentially through each of the nodes to a second portion of the host; and
in each of the nodes, first means and second means for performing at least partially redundant communication and data transmission functions using the communications and data transmission medium, and the first means and second means configured for performing at least partially redundant monitoring or measurement functions on a corresponding energy storage module,
wherein the communications and data transmission medium connects to the plurality of nodes via transformer coupling and frequency division multiplexing, wherein the frequency division multiplexing is performed by respective crossover circuits in the nodes, each crossover circuit comprising a lowpass arm associated with the first means and a highpass arm associated with the second means.

21. A method of communicating and transmitting data in an energy storage system, the method comprising:
receiving, at a node of a plurality of nodes in the energy storage system, a signal from a host to at one of a plurality of nodes in the energy storage system, each of the nodes implemented at a corresponding one of energy storage modules and configured to monitor and control operation of the corresponding energy storage module, the signal received through a communications and data transmission medium forming a loop from a first portion of the host and sequentially through each of the nodes to a second portion of the host;
directing a first portion of the signal to a first device in the node;
directing a second portion of the signal to a second device in the node;
performing, by the first device and based on the first portion, a first function of communication or data transmission; and
performing, by the second device and based on the second portion, a second function of communication or data transmission, the first and second functions being at least partially redundant,
wherein each of the nodes is configured to transmit at least two identical responses to a signal from the host in clockwise and counterclockwise directions in the communications and data transmission medium.

22. The method of claim 21, further comprising configuring the host to send signals in a clockwise direction in the loop only to any of the nodes located before a particular segment of the communications and data transmission medium in the clockwise direction, and to send signals in a counterclockwise direction in the loop only to any of the nodes located before the particular segment in the counterclockwise direction, wherein each of the nodes is configured to respond only in the clockwise or the counterclockwise direction from which the signal arrived at the node.

23. The method of claim 21, wherein the host uses a signaling scheme based on frequency shift keying with Manchester encoding, the method comprising preceding a valid signal with a synchronization sequence recognized by an encoder in each of the nodes, and preceding the synchronization sequence with an illegal pattern that never appears inside a valid signal.

24. The method of claim 21, wherein the node includes a filter that performs frequency discrimination on a first signal and a second signal, the method further comprising determining an approximate signal energy as an addition of an absolute value of the first signal and an absolute value of the second signal or as a maximum of the absolute value of the first signal and the absolute value of the second signal, and comparing the approximate signal energy with a threshold.

25. The method of claim 24, wherein the approximate signal energy is determined as the maximum of the absolute value of the first signal and the absolute value of the second signal, and wherein the threshold is set to a number that requires one extra bit to represent than a width of a data bus in the node, the method further comprising detecting that the approximate signal energy is about to reach the threshold, and discarding the one extra bit before the approximate signal energy equal to the threshold is generated.

26. The method of claim 21, further comprising performing edge detection in each node for detecting a shift of signal energy.

27. The method of claim 26, wherein the edge detection includes convolution on a pulse density stream, the method further comprising down-sampling the pulse density stream so that output samples are produced at a fixed number of times of a rate of a convolution kernel.

28. The method of claim 26, wherein one round of accumulation in the edge detection is performed at such a rate that at most one input pulse arrives during the round of accumulation.

29. The method of claim 28, wherein a positive pulse arrives during the round of accumulation, the method further comprising latching the positive pulse for a next round of accumulation, and thereafter adding or subtracting the positive pulse from accumulator registers, unless a negative pulse also arrives during the round of accumulation, in which case the method further comprises annulling the positive pulse.

* * * * *